United States Patent
Koya

(10) Patent No.: US 8,766,215 B2
(45) Date of Patent: Jul. 1, 2014

(54) CHARGED PARTICLE BEAM DRAWING APPARATUS AND METHOD OF MANUFACTURING ARTICLE

(75) Inventor: Shigeo Koya, Utsunomiya (JP)

(73) Assignee: Canon Kabushiki Kaisha (JP)

(*) Notice: Subject to any disclaimer, the term of this patent is extended or adjusted under 35 U.S.C. 154(b) by 0 days.

(21) Appl. No.: 13/546,079

(22) Filed: Jul. 11, 2012

(65) Prior Publication Data

US 2013/0020502 A1   Jan. 24, 2013

(30) Foreign Application Priority Data

Jul. 19, 2011   (JP) ................ 2011-158452
Jun. 19, 2012   (JP) ................ 2012-138194

(51) Int. Cl.
*G21K 5/08*   (2006.01)
*G21K 5/10*   (2006.01)
*H01J 37/20*   (2006.01)

(52) U.S. Cl.
USPC ............ 250/492.22; 250/491.1; 250/397; 250/492.23; 250/492.3; 355/77

(58) Field of Classification Search
CPC ............ G03F 7/70775; G03F 7/7085; G03F 7/70616; G03F 7/70725; G03F 9/7049; H01J 37/304; H01J 2237/3045; H01J 2237/31769; H01J 37/20; G21K 5/08; G21K 5/10
USPC ............ 250/397, 398, 491.1, 492.22, 492.2, 250/492.3, 453.11; 355/77
See application file for complete search history.

(56) References Cited

U.S. PATENT DOCUMENTS

| | | | | |
|---|---|---|---|---|
| 3,922,546 A * | 11/1975 | Livesay | .................. | 250/310 |
| 5,276,725 A * | 1/1994 | Kawakami et al. | ............ | 378/34 |
| 5,345,085 A * | 9/1994 | Prior | ................ | 250/491.1 |
| 5,801,832 A * | 9/1998 | Van Den Brink | ........ | 356/500 |
| 6,188,464 B1 * | 2/2001 | Makinouchi | ............. | 355/53 |
| 6,194,732 B1 * | 2/2001 | Okino | ............... | 250/491.1 |
| 6,414,325 B1 * | 7/2002 | Yamada et al. | ........ | 250/491.1 |
| 6,515,409 B2 * | 2/2003 | Muraki et al. | ........ | 313/359.1 |
| 6,768,124 B2 * | 7/2004 | Suzuki et al. | ........ | 250/492.2 |

(Continued)

FOREIGN PATENT DOCUMENTS

CN   100454145 C   1/2009
JP   9245708 A   9/1997

(Continued)

OTHER PUBLICATIONS

Taiwanese Office Action for corresponding TW 101125352, mail date Apr. 2, 2014. English translation provided.

*Primary Examiner* — David A Vanore
(74) *Attorney, Agent, or Firm* — Rossi, Kimms & McDowell, LLP

(57) ABSTRACT

A charged particle beam drawing apparatus includes: a charged particle optical system; a substrate stage; an interferometer configured to measure a position of the stage in the direction of the optical axis of the charged particle optical system; a measuring device configured to measure a characteristic of the charged particle beam; and a controller configured to correct the measurement, obtained by the interferometer, using correction information. The controller is configured to cause first measurement as measurement by the interferometer and second measurement as measurement by the measuring device to be performed in parallel, and to obtain the correction information based on the first measurement and the second measurement obtained with respect to each of the plurality of positions.

12 Claims, 3 Drawing Sheets

(56) References Cited

U.S. PATENT DOCUMENTS

| | | | |
|---|---|---|---|
| 6,812,045 B1 * | 11/2004 | Nikoonahad et al. | 438/14 |
| 6,906,782 B2 * | 6/2005 | Nishi | 355/53 |
| 6,917,433 B2 * | 7/2005 | Levy et al. | 356/630 |
| 7,142,314 B2 * | 11/2006 | Nguyen et al. | 356/620 |
| 7,230,252 B2 * | 6/2007 | Muraki et al. | 250/396 R |
| 7,262,860 B2 * | 8/2007 | Hill | 356/500 |
| 7,385,194 B2 * | 6/2008 | Kamimura et al. | 250/306 |
| 7,450,245 B2 * | 11/2008 | Woods et al. | 356/484 |
| 8,218,129 B2 * | 7/2012 | Shibazaki et al. | 355/72 |
| 8,237,919 B2 * | 8/2012 | Shibazaki et al. | 355/72 |
| 8,264,669 B2 * | 9/2012 | Shibazaki | 355/72 |
| 8,325,325 B2 * | 12/2012 | Shibazaki | 355/72 |
| 8,488,106 B2 * | 7/2013 | Shibazaki et al. | 355/72 |
| 8,488,109 B2 * | 7/2013 | Shibazaki | 355/77 |
| 2013/0020502 A1 * | 1/2013 | Koya | 250/453.11 |
| 2013/0098274 A1 * | 4/2013 | Kobayashi | 108/20 |
| 2013/0149647 A1 * | 6/2013 | Maehara et al. | 430/296 |

FOREIGN PATENT DOCUMENTS

| | | |
|---|---|---|
| JP | 3647128 B2 | 5/2005 |
| TW | 436915 B | 5/2001 |
| TW | 2008-22180 B | 5/2008 |

\* cited by examiner

CHARGED PARTICLE BEAM DRAWING APPARATUS AND METHOD OF MANUFACTURING ARTICLE

BACKGROUND OF THE INVENTION

1. Field of the Invention

The present invention relates to a charged particle beam drawing apparatus, and a method of manufacturing an article.

2. Description of the Related Art

In recent years, an electron beam drawing apparatus is expected to be used in the lithography step of a semiconductor process with the tendency to pattern miniaturization due to its high resolution. Japanese Patent Laid-Open No. 09-245708 discloses a multiple electron beam drawing apparatus which splits an electron beam emitted by an electron source into a plurality of electron beams to draw using the plurality of electron beams in parallel.

However, a multiple electron beam drawing apparatus especially uses a column and a substrate with a narrow gap between them, although this arrangement is not limited to a multiple electron beam drawing apparatus. This makes it difficult to implement a measuring device which directly measures the position (surface shape), in the Z-direction, of the substrate arranged below the column. To combat this problem, the position of the substrate in the Z-direction can be measured while it is arranged at a position different from that below the column, and the position of a substrate stage relative to a Z reference mirror in the Z-direction can be controlled based on the measured value, thereby controlling the position of the substrate in the Z-direction. Unfortunately, in this method, the flatness of the Z reference mirror becomes an error factor of Z-direction position measurement, thus degrading the drawing precision.

SUMMARY OF THE INVENTION

The present invention provides, for example, a drawing apparatus advantageous in accurate positioning of a substrate for focusing.

The present invention provides a drawing apparatus which performs drawing on a substrate with a charged particle beam, the apparatus comprising: a charged particle optical system configured to emit the charged particle beam toward the substrate; a stage configured to hold the substrate and to be moved in a direction of an optical axis of the charged particle optical system and a direction perpendicular to the optical axis; an interferometer including a reference reflecting surface, and configured to measure a position of the stage in the direction of the optical axis; a measuring device configured to measure a characteristic of the charged particle beam; and a controller configured to correct measurement, obtained by the interferometer, using correction information, wherein the controller is configured to cause, with respect to each of a plurality of positions of the stage in the direction perpendicular to the optical axis, first measurement as measurement by the interferometer and second measurement as measurement by the measuring device to be performed in parallel, and to obtain the correction information based on the first measurement and the second measurement obtained with respect to each of the plurality of positions Further features of the present invention will become apparent from the following description of exemplary embodiments with reference to the attached drawings.

DESCRIPTION OF THE EMBODIMENTS

Figure 1:
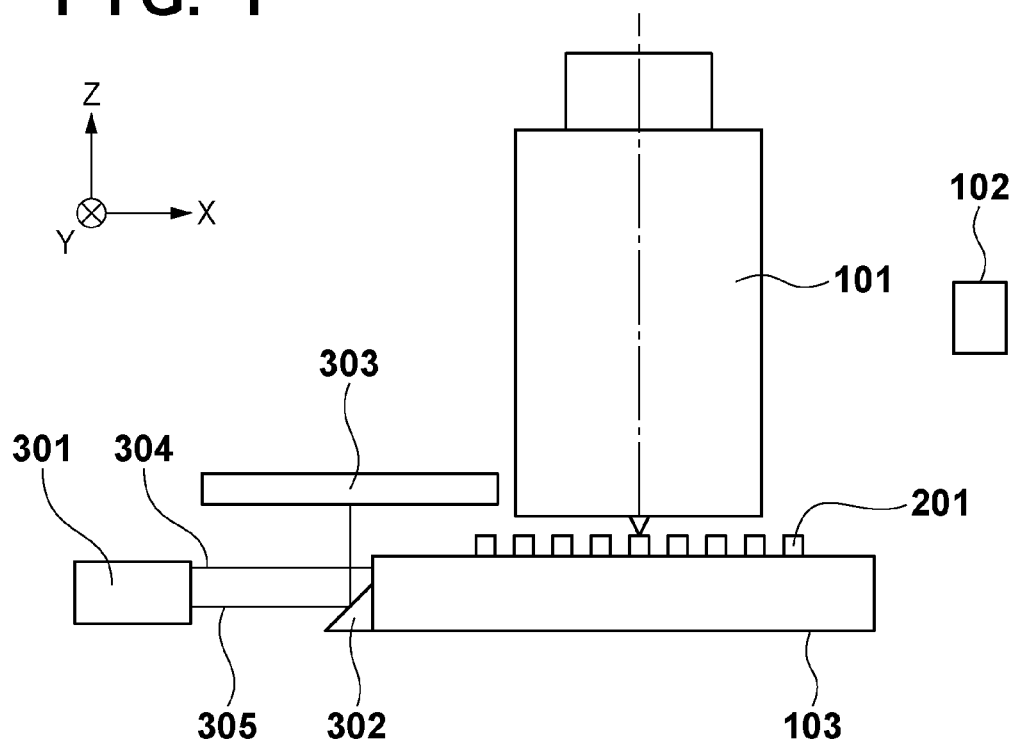
FIG. 1 is a diagram for explaining an electron beam drawing apparatus in the first embodiment.

Embodiments of the present invention will be described in detail below with reference to the accompanying drawings. Note that the same reference numerals denote the same members throughout the drawings, and a repetitive description thereof will not be given. The present invention is applicable to general drawing apparatuses which draw on substrates using charged particle beams, but will be described by taking as an example its application to a drawing apparatus which draws on a substrate using an electron beam.

[First Embodiment]

An electron beam drawing apparatus according to the first embodiment will be described with reference to FIG. 1. The electron beam drawing apparatus includes an electron gun which emits an electron beam, an electron optical system (charged particle optical system), and a stage 103. The electron optical system splits the electron beam emitted by the electron gun into a plurality of electron beams, and guides the plurality of split electron beams onto a substrate to form images of these electron beams on the substrate. The stage 103 holds the substrate, and is capable of moving in the Z-direction; that is, the direction of the optical axis of the electron optical system; and the X- and Y-directions perpendicular to the optical axis. The electron optical system is contained in a lens barrel (column or containment member) 101. The vertical interval between the substrate and the lower surface of the column 101 is as narrow as 1 mm or less. Hence, the electron beam drawing apparatus cannot include a focus sensor for performing focus measurement of the substrate at the optical axis position of the column 101.

Figure 2:
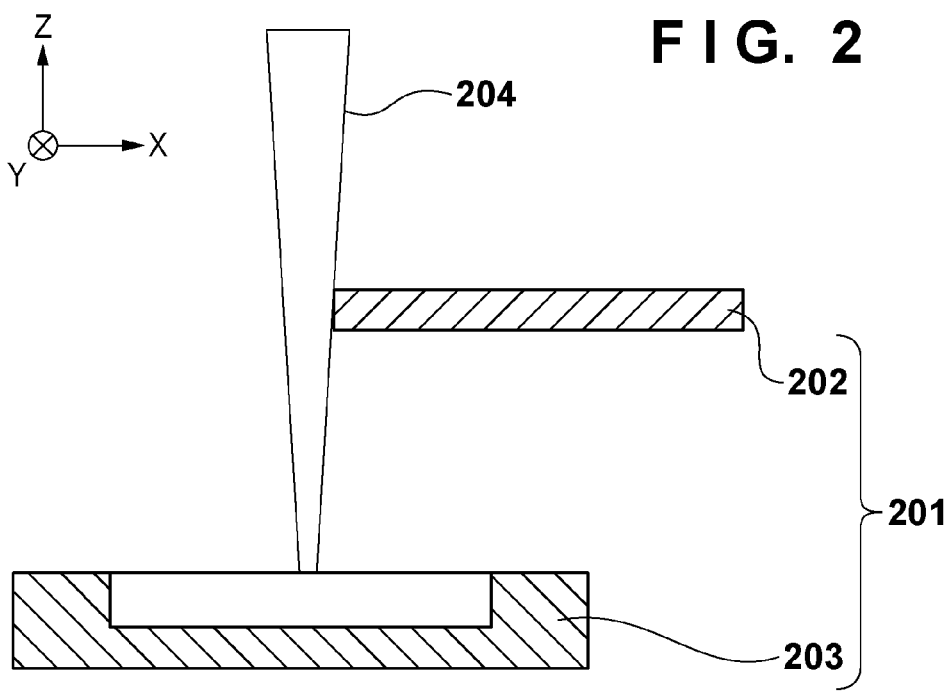
FIG. 2 is a view for explaining electron beam measurement in the first embodiment.
Figure 3:
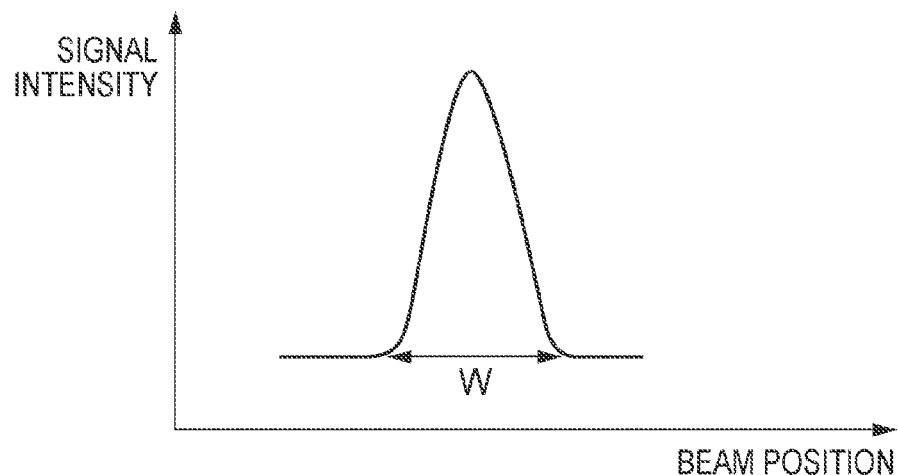
FIG. 3 is a graph showing the measurement result obtained in the first embodiment.

Measurement (first measurement) of the vertical position (Z-position) of the stage 103 by measuring the electron beam diameter will be described with reference to FIG. 2. A measuring device 201 in the first embodiment includes a set of a knife edge (shield member) 202 and a photodiode (detector) 203 arranged at each of a plurality of positions in the X direction on the stage 103. An electron beam 204 is scanned in the X-direction so as to intersect with the direction (Y-direction) in which the knife edge 202 extends, and a current generated by an electron beam which is not blocked by the corresponding knife edge 202 is detected by the photodiode 203. The current value maximizes when the electron beam 204 is not blocked by the knife edge 202 at all, and becomes zero when the electron beam 204 is completely blocked by the knife edge 202. A signal intensity distribution, as shown in FIG. 3, can be obtained by differentiating the waveform of the current detected by the photodiode 203. The use of this signal intensity distribution makes it possible to obtain an electron beam diameter denoted by reference symbol W in FIG. 3. The electron beam travels toward the photodiode 203 in a tapered shape, as shown in FIG. 2. This means that the electron beam diameter changes depending on the Z-position of the photodiode 203, that is, the Z-position of the stage 103. Hence, the Z-position of the stage 103 can be measured by obtaining the data of the relationship between the electron beam diameter and the Z-position of the measuring device 201 (for example, the photodiode 203) relative to the column 101 in advance. Although the use of the photodiode 203 has been taken as an example in this embodiment, a Faraday cup or a CCD, for example, can also be used for the detector which detects the electron beam.

Measurement (second measurement) of the Z-position of the stage 103 using an interferometer in parallel with the measurement (first measurement) which uses the photodiode (detector) 203 will be described next. Reference light 304 emitted by an interferometer 301 which uses a laser head (not shown) as a light source is reflected by a reflecting surface set on the stage 103, and travels back the way it came to return to the interferometer 301. Measurement light 305 is reflected vertically upward by a reflector 302 having a reflecting surface which is set on the stage 103 and changes the direction of the optical path from the X-direction to the Z-direction. The measurement light 305 reflected vertically upward is further reflected by the reference reflecting surface of a bar mirror (reference reflector) 303, and travels back the way it came to return to the interferometer 301. The bar mirror 303 is fixed on, for example, a base which supports the column 101 at a position above the stage 103, and the positional relationship of the reference reflecting surface of the bar mirror 303 with the column 101 in the Z-direction is practically controlled. The Z-position of the stage 103 is measured based on a change in difference between the optical path length of the measurement light 305 and that of the reference light 304 to position the stage 103 in the Z-direction using the measured value. The optical path length of the measurement light 305 is the total optical path length of the optical path to the reflecting surface of the reflector 302 and that between this reflecting surface and the reference reflecting surface of the bar mirror 303.

However, when the stage 103 is driven in, for example, the X-direction, the positioning accuracy of the stage 103 in the Z-direction is influenced by the Z-flatness of the bar mirror 303, that serves as a reference reflector in the Z-direction, over the entire length in the X-direction, that is, the longitudinal direction. If the bar mirror 303 has unevenness in the X-direction, the measurement result of the Z-position of the stage 103 obtained by the interferometer 301 includes a measurement error due to the unevenness of its reference reflecting surface. As a result, when drawing is done while the position of the stage 103 is controlled based on the measurement result obtained by the interferometer 301, and if, for example, the incident angle of the electron beam on the substrate varies, the position at which the substrate is irradiated with the electron beam changes in the X-direction, leading to degradation in overlay precision. This variation may also lead to defocus of the electron beam with respect to the substrate. Note that the configuration of the interferometer 301 is not limited to the above-mentioned configuration, and the present invention is applicable to any configuration as long as it includes a reference reflector (reference reflecting surface) serving as a reference for position measurement.

In the first embodiment, in measuring the Z-position of the stage 103 using the interferometer 301, the electron beam 204 is scanned relative to the knife edge 202 to measure the Z-position of the stage 103 by additionally using the measuring device 201 which measures the electron beam diameter. The measuring device 201 includes a plurality of sets of a knife edge 202 and a photodiode 203. By measuring the Z-position of the stage 103 using the interferometer 301 and measuring device 201 while moving the stage 103 in the X-direction, both the value measured using the interferometer 301 and that measured using the measuring device 201 can be obtained at each of the plurality of positions in the X-direction. The value measured using the electron beam by the measuring device 201 may include the influence of the differences in position in the Z-direction among the plurality of knife edges 202. However, the differences in level among the knife edges 202 can be eliminated by, for example, measuring the levels of the plurality of knife edges 202 in advance and eliminating the influence of their Z-positions, or measuring the levels of the knife edges 202 using two or more beams which have a known relative difference in characteristic and with which the substrate is irradiated at different positions in the X-direction. More specifically, the differences in level among the knife edges 202 can be eliminated by measuring the levels of the knife edges 202 using two or more beams which have a known relative difference in characteristic and with which the substrate is irradiated at different positions in the X-direction. The plurality of knife edges 202 are irradiated with the electron beam and measured, and are then measured again using another beam. The same knife edges 202 are measured but nonetheless the same measured values may not sometimes be obtained. This is because these measured values have errors in the Z-direction depending on the X-position of the stage 103, that is, they are influenced by the flatness of the bar mirror 303 in the Z-direction. Taking the above-mentioned measure, however, makes it possible to measure the flatness (correction information) of the bar mirror 303 in the Z-direction free from the influence of the differences in level among the knife edges 202.

The flatness of the bar mirror 303 in the Z-direction obtained in the foregoing way is stored in a memory of a processor (not shown) which controls the stage 103. When the stage 103 is to be driven in an actual drawing sequence, a controller 102 calculates the correction value of the bar mirror 303 from its target position to correct the Z-position of the stage 103. As a result, the stage 103 can be positioned at an ideal position obtained by correcting the flatness of the bar mirror 303. This makes it possible to improve the position accuracy of the substrate in the Z-direction and, eventually, to improve the overlay precision. Although the measuring device 201 measures the electron beam diameter, the present invention is not limited to this. The measuring device 201 may also measure, for example, the position of the electron beam. More specifically, a position exhibiting the peak of intensity distribution of a signal, as shown in FIG. 3, is obtained by moving the stage 103 while the electron beam is deflected by a predetermined angle in the x-direction by a deflector, and measuring the electron beam using the measuring device 201. A position exhibiting the peak of intensity distribution of a signal, as shown in FIG. 3, is obtained by moving the stage 103 while the electron beam is deflected by a predetermined angle in the x-direction opposite to that of the above-mentioned deflection operation, and measuring the electron beam using the measuring device 201. The difference between these peak positions (inter-peak distance) changes depending on the difference inbetween the z-positions of the photodiode 203 between the two measurements in which the x-positions of the stage 103 are different from each other, that is, the difference between the z-positions of the stage 103. The dependence of the difference between the peak positions on the difference between the z-positions of the stage 103 is based on the premise that the incidence angle of the electron beam deflected by a deflector on the measuring device 201 shifts from 0°. Hence, the difference between the z-positions of the stage 103 can be measured by obtaining the data of the relationship between the inter-peak distance and the difference between the position of the measuring device 201 (for example, the photodiode 203) and the column 101 in the Z-direction in advance. However, other characteristics of the electron beam (for example, a beam shape of the electron beam), which are correlated with the defocus amount of the electron beam in the optical axis direction (the distance between the crossover and the substrate surface in the optical axis direction), may be measured by the measuring device 201. An error of the flatness of the reference reflecting surface can be obtained based on the information (obtained in advance) of the relationship between the above-mentioned characteristics and the defocus amount. Alternatively, an error of the flatness of the reference reflecting surface can be obtained based on the amount of movement of the stage 103 in the Z-direction, which is required to allow the defocus amount to fall within the tolerance based on the above-mentioned characteristics.

[Second Embodiment]

Figure 4:
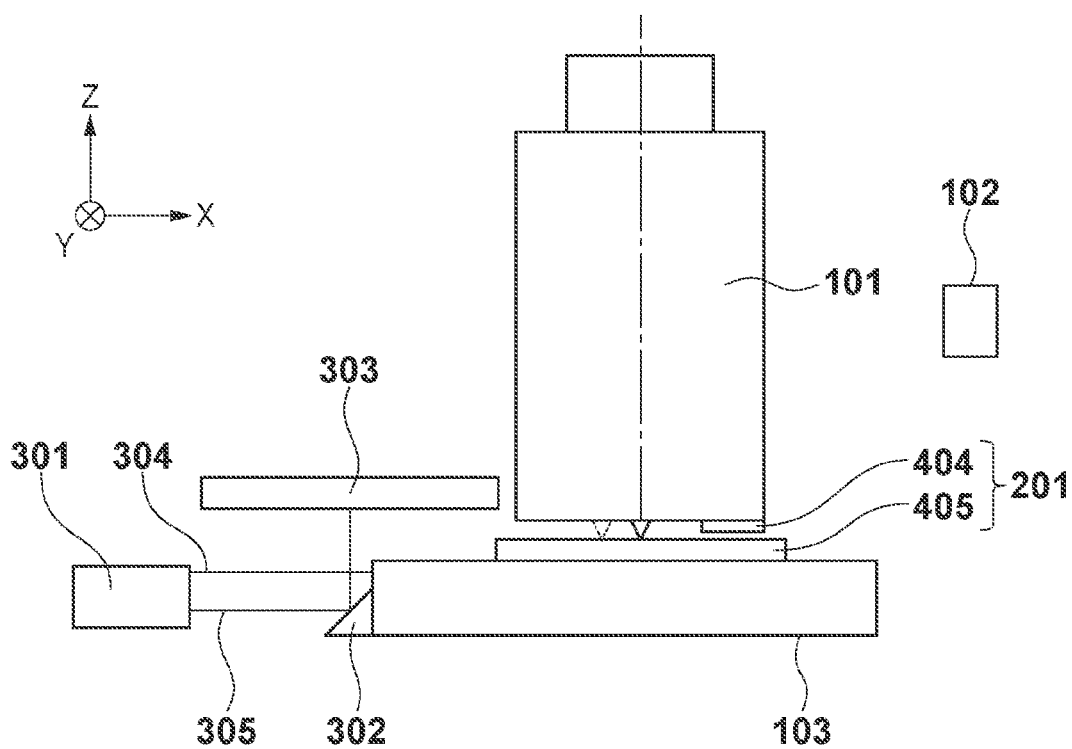
FIG. 4 is a diagram for explaining an electron beam drawing apparatus in the second embodiment.
Figure 5:
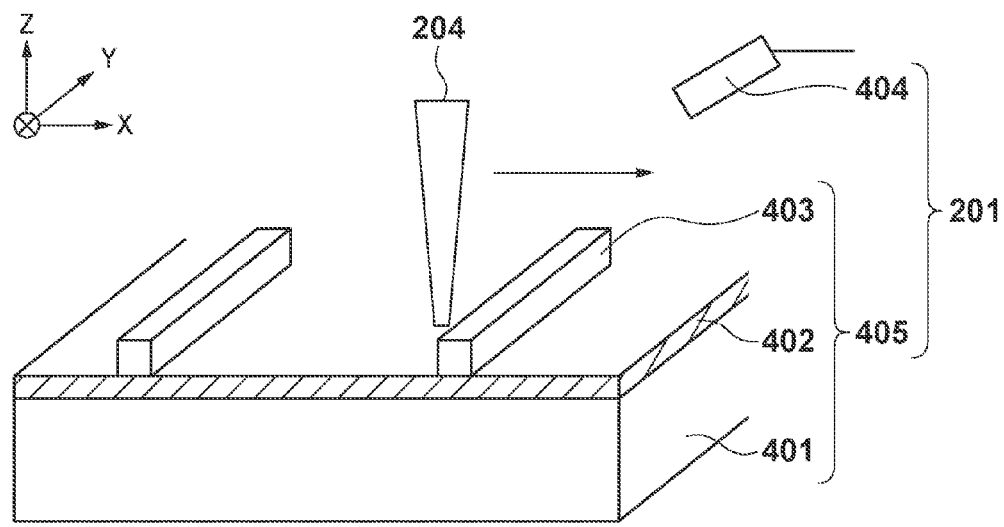
FIG. 5 is a view for explaining electron beam measurement in the second embodiment.
Figure 6:
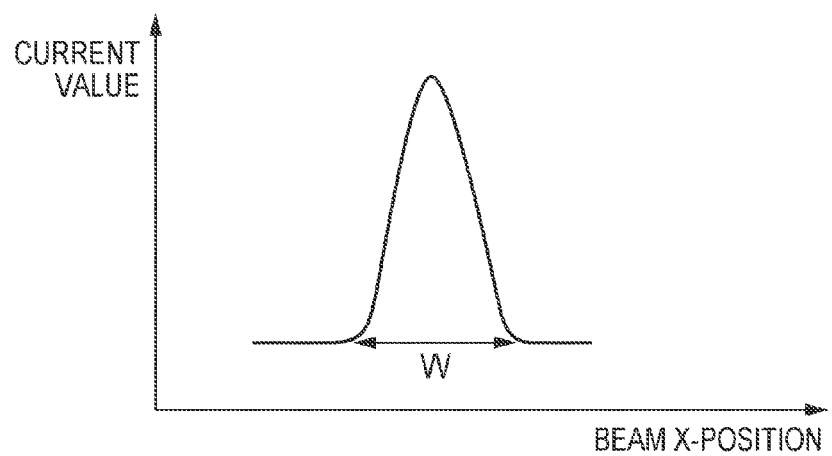
FIG. 6 is a graph showing the measurement result obtained in the second embodiment.

An electron beam drawing apparatus according to the second embodiment will be described with reference to FIGS. 4 and 5. The electron beam drawing apparatus in the second embodiment is different from that in the first embodiment in specification of a measuring device 201 which measures the electron beam diameter. The measuring device 201 which measures the electron beam diameter in the second embodiment will be described. A reference wafer 405 having a plurality of reflective marks (marks) 403 formed on it to align themselves in the X-direction is mounted on a stage 103. On the other hand, a reflected electron measuring device (detector) 404 which detects a current generated by an electron beam scattered or reflected by the marks 403 irradiated with the electron beam is attached to the lower portion of a column 101. The marks 403 are made of, for example, tungsten or gold, and formed on an aluminum thin film 402 on a substrate 401 to extend in a band shape in the Y-direction. An electron beam 204 is deflected in the X-direction by a deflector, and scanned so as to intersect with the marks 403. The reflected electron measuring device 404 detects an electron beam generated upon its scanning on the marks 403 to obtain a current waveform as shown in FIG. 6. A diameter W of each electron beam 204 which impinges on the marks 403 can be obtained from the current distribution of the electron beam 204 from the leading and trailing edges of each waveform. Because the electron beam diameter changes depending on the Z-position of the mark 403, the Z-position of the mark 403 and, eventually, the Z-position of the stage 103 can be calculated by obtaining the relationship between the electron beam diameter and the Z-position of the mark 403 in advance.

When the Z-position of the stage 103 is measured using an interferometer 301, the same problem as described in the first embodiment is posed. To combat this problem, in measuring the Z-position of the stage 103 using the interferometer 301, the electron beam 204 is scanned so as to intersect with the marks 403, thereby obtaining both the value measured using the interferometer 301 and that measured using the electron beam. Because the marks 403 are formed at a plurality of positions in the X-direction on the reference wafer 405, both the value of the Z-position of the stage 103 measured using the interferometer 301, and that measured using the electron beam can be obtained. This makes it possible to obtain the flatness, in the Z-direction, of a bar mirror 303 over the entire length in the X-direction using the two measured values. At this time, the value measured using the electron beam includes the influence of the differences in level in the Z-direction among the plurality of marks 403. However, the differences in level in the Z-direction among the marks 403 can be eliminated by measuring the levels of the marks 403 using two or more beams which have a known relative difference in characteristic and with which the substrate is irradiated at different positions in the X-direction. More specifically, the plurality of marks 403 are irradiated with one electron beam and measured, and are then measured again using another electron beam. The Z-position of the stage 103 is measured at the positions of the same marks 403 but nonetheless the same measured values may not always be obtained. This is because these measured values have errors in the Z-direction upon X driving of the stage 103, that is, they are influenced by the processing accuracy of the bar mirror 303 serving as a Z reference mirror. Taking the above-mentioned measure, however, makes it possible to measure the flatness (correction information) of the bar mirror 303 in the Z-direction over the entire length in the X-direction free from the influence of the differences in level among the marks 403.

The flatness of the bar mirror 303 in the Z-direction obtained in the foregoing way is stored in a memory of a processor (not shown) which controls the stage 103. When the stage 103 is to be driven in an actual drawing sequence, the correction value of the bar mirror 303 can be calculated from its target position to correct the Z-position of the stage 103. As a result, the stage 103 can be positioned at an ideal position obtained by correcting the flatness of the bar mirror 303. This makes it possible to improve the position accuracy of the substrate in the Z-direction and, eventually, to improve the overlay precision.

Although the electron beam is scanned by the deflector to move it relative to the marks 403 in the above-mentioned embodiments, the stage 103 may be moved to relatively move them. Also, although reflected electrons are detected to obtain a current waveform in the above-mentioned embodiments, secondary electrons (charged particles) generated when the electron beam impinges on the marks 403 may be detected to obtain a current waveform. Moreover, although the measuring device 201 measures the electron beam diameter, the present invention is not limited to this. The measuring device 201 may also measure, for example, the position of the electron beam (for example, a position exhibiting a peak intensity), as described above. However, other characteristics of the electron beam (for example, a beam shape of the electron beam), which are correlated with the defocus amount of the electron beam in the optical axis direction (the distance between the crossover and the substrate surface in the optical axis direction), may be measured. Also, an error of the flatness of the reference reflecting surface can be obtained based on the information (obtained in advance) of the relationship between the above-mentioned characteristics and the defocus amount. Alternatively, an error of the flatness of the reference reflecting surface can be obtained based on the amount of movement of the stage 103 in the Z-direction, which is required to allow the defocus amount to fall within the tolerance based on the above-mentioned characteristics.

[Embodiment of Method of Manufacturing Article]

A method of manufacturing an article according to an embodiment of the present invention is suitable for manufacturing an article such as a microdevice such as a semiconductor device or an element having a microstructure. This method can include a step of forming a latent image pattern on a photosensitive agent, coated on a substrate, using the above-mentioned drawing apparatus (a step of drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous in at least one of the performance/quality/productivity/manufacturing cost of an article than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-158452 filed Jul. 19, 2011 and 2012-138194 filed Jun. 19, 2012 which are hereby incorporated by reference herein in their entirety.

What is claimed is:

1. A drawing apparatus for drawing on a substrate with a charged particle beam, the apparatus comprising:
   a charged particle optical system configured to emit the charged particle beam toward the substrate;
   a stage configured to hold the substrate and to be movable in a direction of an optical axis of the charged particle optical system and a direction perpendicular to the optical axis;
   an interferometer, including a reference reflecting surface, configured to measure a position of the stage in the direction of the optical axis;
   a measuring device configured to measure a characteristic of the charged particle beam; and
   a controller configured to correct measurement, obtained by the interferometer, using correction information,
   wherein the controller is configured to cause, with respect to each of a plurality of positions of the stage in the direction perpendicular to the optical axis, first measurement as measurement by the interferometer and second measurement as measurement by the measuring device to be performed in parallel, and to obtain the correction information based on the first measurement and the second measurement obtained with respect to each of the plurality of positions.

2. The apparatus according to claim 1, wherein the controller is configured to obtain the correction information further based on information of a relationship between a defocus amount of the charged particle beam in the direction of the optical axis and the characteristic.

3. The apparatus according to claim 1, wherein:
   the measuring device includes a set of a shield member and a detector, arranged at each of a plurality of positions on the stage, and
   the detector is configured to detect a charged particle beam of which at least a part is not shielded by the shield member corresponding thereto.

4. The apparatus according to claim 1, wherein the measuring device includes a mark arranged at each of a plurality of positions on the stage, and a detector configured to detect a charged particle beam scattered or emitted by the mark irradiated with the charged particle beam.

5. The apparatus according to claim 1, further comprising:
   a housing for the charged particle optical system,
   wherein the drawing is performed with a gap, in the direction of the optical axis between the housing and the substrate held by the stage, made to be not greater than 1 mm.

6. The apparatus according to claim 1, wherein the measuring device includes a mark arranged at each of a plurality of positions on the stage, and a detector configured to detect a charged particle beam scattered or emitted by the mark irradiated with the charged particle beam.

7. The apparatus according to claim 1, further comprising:
   a housing for the charged particle optical system,
   wherein the drawing is performed with a gap, in the direction of the optical axis between the housing and the substrate held by the stage, made to be not greater than 1 mm.

8. A method of manufacturing an article, the method comprising the steps of:
   drawing on a substrate using a drawing apparatus;
   developing the substrate on which the drawing has been performed; and
   processing the developed substrate to manufacture the article,
   wherein the drawing apparatus draws on the substrate with a charged particle beam, and includes:
   a charged particle optical system configured to emit the charged particle beam toward the substrate;
   a stage configured to hold the substrate and be movable in a direction of an optical axis of the charged particle optical system and a direction perpendicular to the optical axis;
   an interferometer, including a reference reflecting surface, configured to measure a position of the stage in the direction of the optical axis;
   a measuring device configured to measure a characteristic of the charged particle beam; and
   a controller configured to correct measurement, obtained by the interferometer, using correction information,
   wherein the controller is configured to cause, with respect to each of a plurality of positions of the stage in the direction perpendicular to the optical axis, first measurement as measurement by the interferometer and second measurement as measurement by the measuring device to be performed in parallel, and to obtain the correction information based on the first measurement and the second measurement obtained with respect to each of the plurality of positions.

9. A drawing apparatus for drawing on a substrate with a charged particle beam, the apparatus comprising:
   a charged particle optical system configured to emit the charged particle beam toward the substrate;
   a stage configured to hold the substrate and be movable in a direction of an optical axis of the charged particle optical system and a direction perpendicular to the optical axis;
   an interferometer, including a reference reflecting surface, configured to measure a position of the stage in the direction of the optical axis;
   a measuring device configured to measure a characteristic of the charged particle beam correlated with a defocus amount of the charged particle beam; and
   a controller configured to correct measurement, obtained by the interferometer, using correction information,
   wherein the controller is configured to cause, with the stage positioned based on first measurement as measurement by the interferometer, second measurement as measurement by the measuring device to be performed, with respect to each of a plurality of positions of the stage in the direction perpendicular to the optical axis, and to obtain the correction information based on the first measurement and the second measurement obtained with respect to each of the plurality of positions.

10. The apparatus according to claim 9, wherein the controller is configured to obtain the correction information further based on information of a relationship between the characteristic and the defocus amount.

11. The apparatus according to claim 9, wherein:
the measuring device includes a set of a shield member and a detector, arranged at each of a plurality of positions on the stage, and
the detector is configured to detect a charged particle beam of which at least a part is not shielded by the shield member corresponding thereto.

12. A method of manufacturing an article, the method comprising the steps of:
drawing on a substrate using a drawing apparatus;
developing the substrate on which the drawing has been performed; and
processing the developed substrate to manufacture the article,
wherein the drawing apparatus draws on the substrate with a charged particle beam, and includes:
a charged particle optical system configured to emit the charged particle beam toward the substrate;
a stage configured to hold the substrate and be movable in a direction of an optical axis of the charged particle optical system and a direction perpendicular to the optical axis;
an interferometer, including a reference reflecting surface, configured to measure a position of the stage in the direction of the optical axis;
a measuring device configured to measure a characteristic of the charged particle beam correlated with a defocus amount of the charged particle beam; and
a controller configured to correct measurement, obtained by the interferometer, using correction information,
wherein the controller is configured to cause, with the stage positioned based on first measurement as measurement by the interferometer, second measurement as measurement by the measuring device to be performed, with respect to each of a plurality of positions of the stage in the direction perpendicular to the optical axis, and to obtain the correction information based on the first measurement and the second measurement obtained with respect to each of the plurality of positions.

* * * * *